United States Patent [19]
Hosokawa

[11] Patent Number: 5,356,512
[45] Date of Patent: Oct. 18, 1994

[54] METHOD OF STACKING CERAMIC GREEN SHEETS

[75] Inventor: Takao Hosokawa, Kyoto, Japan

[73] Assignee: Murata Mfg. Co., Ltd., Japan

[21] Appl. No.: 988,222

[22] Filed: Dec. 9, 1992

[30] Foreign Application Priority Data

Dec. 9, 1991 [JP]  Japan .................................. 3-324500

[51] Int. Cl.5 .............................................. B32B 31/04
[52] U.S. Cl. .................................... 156/634; 156/629;
  156/89; 156/230; 156/235; 156/238
[58] Field of Search ............... 156/89, 230, 235, 238,
  156/239, 629, 634

[56] References Cited

U.S. PATENT DOCUMENTS

| | | | |
|---|---|---|---|
| 4,799,984 | 1/1989 | Rellick | 156/89 |
| 4,929,295 | 5/1990 | Kohno et al. | 156/230 |
| 5,009,744 | 4/1991 | Mandai et al. | 156/89 X |

*Primary Examiner*—Thi Dang
*Attorney, Agent, or Firm*—Ostrolenk, Faber, Gerb & Soffen

[57] ABSTRACT

To improve transferability for stacking ceramic green sheets through a transfer technique, a ceramic green sheet formed on a first back film is heated and pressurized by rolls so as to be transferred to a second back film. Thereafter, the transferred ceramic green sheet is compression bonded through a contact surface defined by a surface exposed by separation of the first back film to at least one other ceramic green sheet which has been already stacked.

16 Claims, 2 Drawing Sheets

FIG. 1
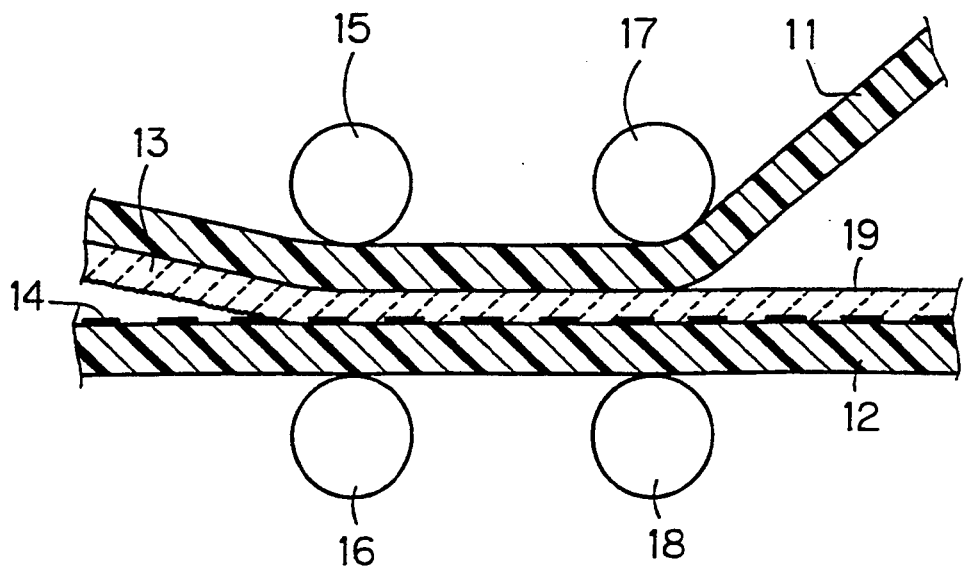
FIG. 2A
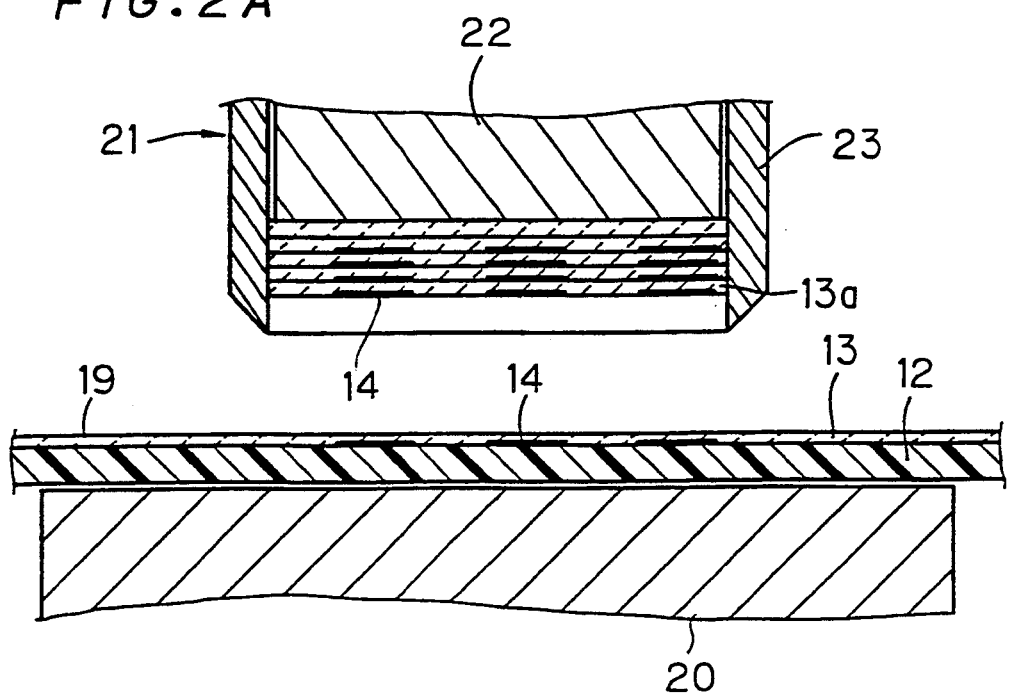
FIG. 2B

METHOD OF STACKING CERAMIC GREEN SHEETS

BACKGROUND OF THE INVENTION

1. Field of the Invention

The present invention relates to a method of stacking ceramic green sheets, and more particularly, the invention relates to a method of stacking ceramic green sheets for manufacturing a multilayer ceramic electronic component.

2. Description of the Background Art

In order to manufacture a multilayer ceramic electronic component such as a multilayer ceramic capacitor, for example, it is necessary to stack ceramic green sheets.

The thickness of such ceramic green sheets is advantageously minimized for attaining large electrostatic capacitance in, for example a multilayer ceramic capacitor. Thus, the distances between internal electrodes can be reduced and the number of layers of such internal electrodes can be increased in a prescribed dimensional range.

In order to stack such thin ceramic green sheets, a transfer technique is advantageously employed. According to this transfer technique, a ceramic green sheet is lined with a proper back film and compression-bonded in this state to other ceramic green sheets which are already stacked with each other so that the former ceramic green sheet is transferred to the stacked ceramic green sheets. Thereafter, the back film is separated from the transferred ceramic green sheet.

In order to obtain a multilayer ceramic capacitor through the aforementioned transfer technique, two methods are typically carried out as follows:

(1) A ceramic green sheet, which is formed on a back film, and internal electrode films, which are formed on another back film, are alternately transferred.

(2) As shown in FIG. 4, internal electrode films 2 are provided on a back film 1 and a ceramic green sheet 3 is formed on this back film 1 to cover the internal electrode films 2, so that the internal electrode films 2 and the ceramic green sheet 3 are integrally transferred. Alternatively, a ceramic green sheet 3 is formed on a back film 1 and internal electrode films 2 are provided on the ceramic green sheet 3 as shown in FIG. 5, so that the ceramic green sheet 3 and the internal electrode films 2 are integrally transferred.

However, the aforementioned method (1) has low productivity since the internal electrode films and the ceramic green sheet are alternately transferred, and hence this method has been applied only to specific items. On the other hand, the method (2) has excellent productivity since the internal electrode films 2 and the ceramic green sheet 3 are already integrated with each other which facilitate the handling.

In the transfer technique, discussed above transferability of the ceramic green sheets depends on the effective action of a binder contained in the ceramic green sheets, sufficient smoothness of the surface of the ceramic green sheet which is brought into contact with the already stacked ceramic green sheets to be transferred thereto, and the like.

However, as shown in FIG. 4 or 5, on the surface 4 of the ceramic green sheet 3, which is formed on the back film 1 ceramic particles are arranged randomly so that the sheet surface is irregular and has with insufficient smoothness. Thus, the adhesiveness provided by the surface 4 of the ceramic green sheet 3 is reduced thereby causing defective transfer of the ceramic green sheet 3. This problem also arises in the aforementioned method (1).

In the aforementioned method (2), however, the ceramic green sheet 3 is provided with the internal electrode films 2 on either surface, and hence such internal electrode films 2 are necessarily interposed between two ceramic green sheets which are brought into contact with each other in a transfer step. The adhesive strength between the ceramic green sheet 3 and the internal electrodes 2 is inferior to that the adhesive strength between the two ceramic green sheets. Thus, the aforementioned problem of a reduction in adhesive strength caused by drying of the surface 4 of the ceramic green sheet 3 is particularly serious in the aforementioned method (2).

As hereinabove described, in order to obtain a miniature multilayer ceramic capacitor having large capacitance it is necessary to reduce the thickness of the ceramic green sheets. In doing so, however, defects such as pinholes are increased so that the defective rate of the completed multilayer ceramic capacitors is increased.

The aforementioned problems arise not only in multilayer ceramic capacitors but in general multilayer ceramic electronic components which are manufactured through steps which include the step of stacking ceramic green sheets.

SUMMARY OF THE INVENTION

Accordingly, an object of the present invention is to provide a method of stacking ceramic green sheets, which can solve the aforementioned problems.

The present invention comprises the steps of preparing first and second back films, forming a ceramic green sheet on the first back film, transferring the ceramic green sheet from the first back film to the second back film while directing an outward surface of the ceramic green sheet being formed on the first back film to the second back film, and transferring the ceramic green sheet from the second back film to other ceramic green sheets which are already stacked with each other while directing the outward surface of the ceramic green sheet held by the second back film to the already stacked ceramic green sheets.

In advance of the aforementioned step of transferring the ceramic green sheet from the first back film to the second back film, a patterned functional material film such as an internal electrode film may be formed on the second back film so that the functional material film is transferred with the ceramic green sheet which is transferred to the already stacked ceramic green sheets from the second back film.

The present invention can also be carried out through the steps of preparing first and second back films, forming a first ceramic green sheet on the first back film, providing a patterned functional material film while forming a second ceramic green sheet on the second back film, bringing the first and second ceramic green sheets into contact with each other for transferring the first ceramic green sheet from the first back film to the second ceramic green sheet, and transferring the first and second ceramic green sheets as well as the functional material film from the second back film to other ceramic green sheets which are already stacked with each other while directing an outward surface of the first ceramic green sheet being held by the second back film to the already stacked ceramic green sheets.

According to the present invention, an adhesive surface of the ceramic green sheet to be transferred to the already stacked ceramic green sheets is defined by a surface which is exposed by separation of the first back film, whereby excellent smoothness is attained.

Further, according to the present invention, heat and pressure can be applied to the ceramic green sheet through the first and second back films when the ceramic green sheet is transferred from the first back film to the second back film.

According to the present invention, therefore, it is possible to improve adhesiveness between the ceramic green sheets for stacking the ceramic green sheets by a transfer technique. Thus, reliability in transfer can be improved and the pressure applied for such transfer can be reduced.

Further, it is possible to advantageously eliminate pinholes which may be present in the ceramic green sheet by applying heat and pressure to the ceramic green sheet which is held between the first and second back films, thereby reducing the defective rate of the multilayer ceramic electronic components obtained by stacking such ceramic green sheets. Particularly, when first and second ceramic green sheets are held between the first and second back films, such pinholes are more effectively removed.

When the second back film is provided with a functional material film, such as an internal electrode film, so that the functional film is integrated with the ceramic green sheet to be stacked, it is possible to improve stacking efficiency.

The foregoing and other objects, features, aspects and advantages of the present invention will become more apparent from the following detailed description of preferred embodiments of the present invention when taken in conjunction with the accompanying drawings.

BRIEF DESCRIPTION OF THE DRAWINGS

FIG. 1 is a sectional view showing the step of transferring a ceramic green sheet 13 from a first back film 11 to a second back film 12;

FIG. 2 is a sectional view showing the step of transferring the ceramic green sheet 13 from the second back film 12 to already stacked ceramic green sheets 13a, which is carried out after the step shown in FIG. 1;

DESCRIPTION OF THE PREFERRED EMBODIMENTS

Figure 3:
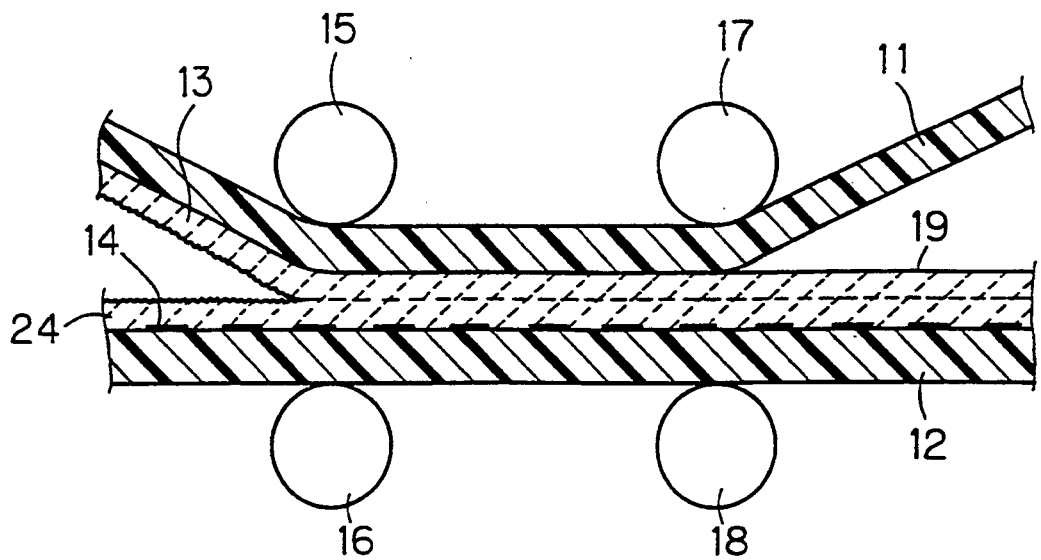
FIG. 3 is a sectional view showing the step corresponding to that shown in FIG. 1 for another embodiment of the present invention.
Figure 4:
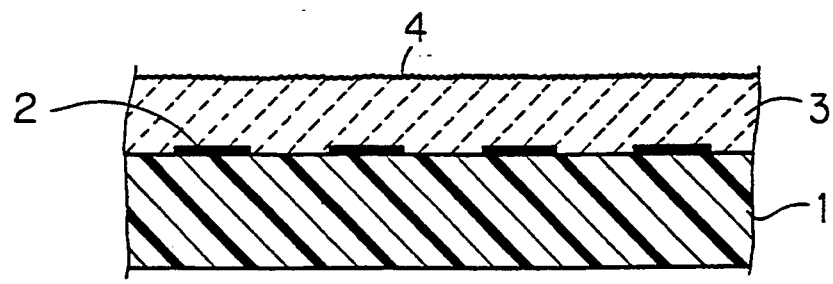
FIG. 4 is a sectional view showing a conventional back film 1 which is provided with internal electrode films 2 thereon and a ceramic green sheet 3 formed on the back film 1.
Figure 5:
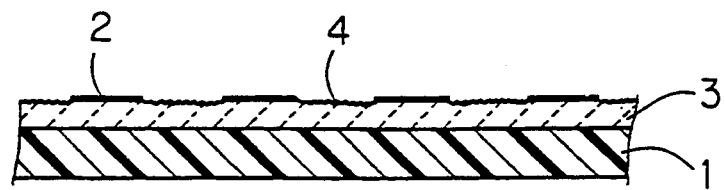
FIG. 5 is a sectional view showing a conventional back film 1 provided with a ceramic green sheet 3 thereon, and internal electrode films 2 formed on the ceramic green sheet 3.

FIGS. 1 and 2 illustrate a first embodiment of the present invention.

As shown in FIG. 1, first and second back films 11 and 12 having smooth surfaces are employed in this embodiment. These back films 11 and 12 are made of polyethylene terephthalate, for example. The back films 11 and 12 are preferably surface-treated with a mold release agent, in order to facilitate smooth separation of a ceramic green sheet as described below.

A ceramic green sheet 13 is formed on the back film 11. Patterned functional material films 14 are formed on the second back film 12. The functional material films 14 are patterned by photoetching, for example.

Then, an outwardly facing surface of the ceramic green sheet 13, provided on the first back film 11 is directed to the second back film 12 so that the ceramic green sheet 13 is brought into contact with the second back film 12. The first and second back films 11 and 12 and the ceramic green sheet 13 are the passed in this state through a pair of rolls 15 and 16, as shown in FIG. 1. The rolls 15 and 16 are adapted to heat and pressurize the ceramic green sheet 13 through the back films 11 and 12.

The back films 11 and 12 and the ceramic green sheet 13 which are passed through the rolls 15 and 16 are cooled and then passed through another pair of rolls 17 and 18, so that the first back film 11 is thereafter separated from the ceramic green sheet 13. Thus, the ceramic green sheet 13 is transferred from the first back film 11 to the second back film 12. An outwardly facing surface of the ceramic green sheet 13 being held by the second back film i.e., a surface 19 exposed by the separation of the first back film 11, has excellent smoothness which compares with that of the back film surface.

FIG. 2 shows a method of stacking the ceramic green sheet 13 which is held in the aforementioned manner by the second back film 12.

The second back film 12 holding the ceramic green sheet 13 is guided onto a stage 20. A stacking apparatus 21 is arranged to face the stage 20. This stacking apparatus 21 can be moved towards and separated from the stage 20 as a whole. The stacking apparatus 21 has a compression bonding head 22, and cutting blades 23 which are provided around the compression bonding head 22. The cutting blades 23 are vertically displaceable with respect to the compression bonding head 22. The stage 20 and/or the compression bonding head 22 contains a heater.

FIG. 2 shows a plurality of ceramic green sheets 13a, which are already stacked with each other, on the compression bonding head 22 in a space enclosed by the cutting blades 23 bonding head 22. The outwardly facing surface 19 of the ceramic green sheet 13, which is held by the second back film 12, is directed toward the already stacked ceramic green sheets. The stacking apparatus 21 is downwardly moved toward the stage 20, whereby the ceramic green sheet 13 is cut by the cutting blades 23 and compression bonded to the already stacked ceramic green sheets 13a. The outwardly facing surface 19 which is compression bonded to the already stacked ceramic green sheets 13a has excellent smoothness, as hereinabove described, whereby a strong compression bonding state can be attained with the already stacked ceramic green sheets 13a.

Then, the stacking apparatus 21 is again separated from the stage 20, so that the ceramic green sheet 13, enclosed by the cutting blades 23, is transferred from the second back film 12 to the already stacked ceramic green sheets 13a.

The step shown in FIG. 2 is repeated a required number of times, to obtain a laminate for a multilayer ceramic electronic component.

In the aforementioned embodiment, the functional material films 14 may not be formed on the second back film 12, but the aforementioned method may be applied to transfer of a ceramic green sheet in a method alternately transferring a ceramic green sheet and functional material films, similarly to the conventional method (1) described above.

FIG. 3 shows another embodiment of the present invention. Referring to FIG. 3, elements corresponding to those shown in FIG. 1 are denoted by similar reference numerals.

According to this embodiment, a second ceramic green sheet 24 is formed on a second back film 12, in addition to functional material films 14. When these elements are passed through a pair of rolls 15 and 16, therefore, a first ceramic green sheet 13 is brought into contact with the second ceramic green sheet 24. After passage through another pair of rolls 17 and 18, a first back film 11 is separated so that the first ceramic green sheet 13 is transferred from the first back film 11 to the second ceramic green sheet 24.

The ceramic green sheets 13 and 24, thus held by the second back film 12, are guided onto the stage 20 in place of the ceramic green sheet 13 held by the second back film 12 as shown in FIG. 2, and stacked similarly to the aforementioned embodiment.

According to the present invention, the ceramic green sheets can be stacked by an apparatus other than that shown in FIG. 2.

Examples carried out according to the present invention are now described.

EXAMPLE 1

As shown in FIG. 1, a ceramic green sheet 13 was formed on a first back film 11 by a slurry of nonreducing dielectric ceramic mainly composed of barium titanate. A metal film of nickel was formed on a second back film 12 and patterned by photoetching, to form functional material films 14 for serving as internal electrode films for a multilayer ceramic capacitor.

Then, the step shown in FIG. 1 was carried out to transfer the ceramic green sheet 13 from the first back film 11 to the second back film 12.

The ceramic green sheet 13 was stacked with the functional material films 14 by thermocompression bonding as shown in FIG. 2, and the laminate so obtained was further cut into the dimensions required for providing a single multilayer ceramic capacitor. Thereafter, this product was fired and then provided with external electrodes, to prepare a multilayer ceramic capacitor.

EXAMPLE 2

An operation similar to that in Example 1 was carried out except that a second ceramic green sheet 24 was formed on a second back film 12 as shown in FIG. 3, to prepare a multilayer ceramic capacitor.

COMPARATIVE EXAMPLE

Similar to the second back film 12 employed in Example 1, a back film provided with patterned functional material films of nickel was prepared. This back film was coated with slurry, which was similar to that employed in Example 1 for forming a ceramic green sheet, and dried.

The ceramic green sheet held by the back film was subjected to steps similar to those in Example 1, to prepare a multilayer ceramic capacitor.

The ceramic green sheets in Example 1 and Comparative Example were 10 $\mu$m in thickness, while each of the first and second ceramic green sheets 13 and 24 in Example 2 were 5 $\mu$m in thickness.

As to Examples 1 and 2 and Comparative Example, transferability levels of the ceramic green sheets were evaluated under various pressures applied for stacking the ceramic green sheets. Table 1 shows the results.

TABLE 1

| Pressure | Example 1 | Example 2 | Comparative Example |
| --- | --- | --- | --- |
| 180 kg/cm$^2$ | A | A | A |
| 150 kg/cm$^2$ | A | A | A |
| 120 kg/cm$^2$ | A | A | B |
| 90 Kg/cm$^2$ | A | A | C |
| 70 Kg/cm$^2$ | B | B | C |

A: nondefective in transfer
B: partially defective in transfer
C: extremely defective in transfer It is apparent from Table 1 that Examples 1 and 2 were superior in transferability to Comparative Example.

Then, initial defective rates (short-circuit factors) of the multilayer ceramic capacitors were investigated as to Examples 1 and 2 and Comparative Example. Table 2 shows the results.

TABLE 2

|  | Short-Circuit Factor |
| --- | --- |
| Example 1 | 2/200 |
| Example 2 | 0/200 |
| Comparative Example | 6/200 |

It is apparent from Table 2 that the short-circuit factors were reduced in Examples 1 and 2 as compared with the Comparative Example, while the short-circuit factor was particular remarkably reduced in Example 2. It is presumed that the short-circuit factor was reduced in each of Examples 1 and 2 as compared with the Comparative Example since pinholes in the ceramic green sheets were removed by the heat and pressure applied in the step of transferring the ceramic green sheet from the first back film 11 to the second back film 12. Moreover, the short-circuit factor was further reduced in Example 2 as compared with Example 1 due to an effect attained by the superposition of two ceramic green sheets.

Although the present invention has been described and illustrated in detail, it is clearly understood that the same is by way of illustration and example only and is not to be taken by way of limitation, the scope of the present invention being limited only by the terms of the appended claims.

What is claimed is:

1. A method of stacking ceramic green sheets, comprising the steps of:
    (a) preparing first and second back films;
    (b) forming a ceramic green sheet on said first back film;
    (c) contacting an outwardly facing first surface of said ceramic green sheet with said second back film and retaining, at lest momentarily, said ceramic green sheet between said first and second back films such that both surfaces of said ceramic green sheet are in direct contact with said first and second back films, respectively;
    (d) transferring said ceramic green sheet from said first back film to said second back film and simultaneously exposing an outwardly facing second surface of said ceramic green sheet by separation of said first back film from said ceramic green sheet; and then (e) transferring said ceramic green sheet from said second back film to at least one other ceramic green sheet, which has been already stacked, by contacting with said already stacked ceramic green sheet.

2. A method of stacking ceramic green sheets in accordance with claim 1, wherein said step (d) includes the step of applying heat and pressure to said ceramic green sheet through said first and second back films while holding said ceramic green sheet between said first and second back films.

3. A method of stacking ceramic green sheets in accordance with claim 1, further comprising the step of forming a patterned functional material film on said second back film in advance of said step (c), said functional material film being transferred with said ceramic green sheet in said step (e) when said ceramic green sheet is transferred from said second back film.

4. A method of stacking ceramic green sheets in accordance with claim 3, wherein said functional material film includes a conductor material film.

5. A method of stacking ceramic green sheets, comprising the steps of:
 (a) preparing first and second back films;
 (b) forming a first ceramic green sheet on said first back film;
 (c) forming an assembly of a patterned functional material film and a second ceramic green sheet on said second back film;
 (d) contacting an outwardly facing first surface of said first ceramic green sheet with said second ceramic green sheet and retaining, at least momentarily, said first and second ceramic green sheets and said functional material film between said first and second back films such that respective surfaces of said first and second ceramic green sheets are in direct contact with said first and second back films, respectively;
 (e) transferring said first ceramic green sheet from said first back film to said second back film and simultaneously exposing an outwardly facing second surface of said first ceramic green sheet by separation of said first back film from said first ceramic green sheet; and then
 (f) transferring said first and second ceramic green sheets and said functional material film to at least one other ceramic green sheet, which has been already stacked, by contacting said outwardly facing second surface of said first ceramic green sheet with said already stacked ceramic green sheet.

6. A method of stacking ceramic green sheets in accordance with claim 5, wherein said step (e) includes the step of applying heat and pressure to said first and second ceramic green sheets through said first and second back films while holding said first and second ceramic green sheets between said first and second back films.

7. A method of stacking ceramic green sheets in accordance with claim 5, wherein in step (c) said second ceramic green sheet is formed on said second back film after providing said functional material film.

8. A method of stacking ceramic green sheets in accordance with claim 5, wherein said functional material film includes a conductor material film.

9. A method of stacking ceramic green sheets, including improving smoothness of both surfaces of each ceramic green sheet to be stacked with at least one previously stacked ceramic green sheet, the method comprising the steps of:
 (a) preparing first and second back films;
 (b) forming a ceramic green sheet on said first back film, said ceramic green sheet having a first and a second surface that are opposite to each other;
 (c) moving said ceramic green sheet while held by said first back film toward said second back film so as to interpose and hold said ceramic green sheet between said first and second back films;
 (d) treating said ceramic green sheet while held between said first and second back films so as to improve smoothness of both the surfaces of said ceramic green sheet;
 (e) transferring said ceramic green sheet from said first back film to said second back film and simultaneously exposing the first surface of said ceramic green sheet by separation of said first back film from said ceramic green sheet; and
 (f) transferring said ceramic green sheet from said second back film to at least one other ceramic green sheet, which has been already stacked, by contacting said exposed first surface of said ceramic green sheet with said already stacked ceramic green sheet, thereby exposing the second surface of said ceramic green sheet by simultaneously separating said second back film.

10. A method of stacking ceramic green sheets in accordance with claim 9, wherein the step (d) includes the step of applying heat and pressure to said ceramic green sheet through said first and second back films while holding said ceramic green sheet between said first and second back films.

11. A method of stacking ceramic green sheets in accordance with claim 9, further comprising the step of forming a patterned functional material film on said second back film in advance of the step(e), said functional material film being transferred with said ceramic green sheet in the step(f) when said ceramic green sheet is transferred from said second back film.

12. A method of stacking ceramic green sheets in accordance with claim 11, wherein said functional material film includes a conductive material film.

13. A method of stacking ceramic green sheets in accordance with claim 9, wherein said ceramic green sheet is transferred from said first back film to said second back film by directly contacting, with said second back film, the outwardly facing second surface of said ceramic green sheet and then separating said first back film.

14. A method of stacking ceramic green sheets in accordance with claim 9, further comprising the steps of:
 forming an assembly of a patterned functional material film and a second ceramic green sheet on said second back film before the step (c);
 the step (e) comprising transferring said first-mentioned ceramic green sheet from said first back film to said second back film by bringing said first and second ceramic green sheets into contact with each other and then separating said first back film; and
 the step(f) includes transferring said first and second ceramic green sheets and said functional material film to said at least one other ceramic green sheet.

15. A method of stacking ceramic green sheets in accordance with claim 14, wherein the step (d) includes the step of applying heat and pressure to said first and second ceramic green sheets through said first and second back films while holding said first and second ceramic green sheets between said first and second back films.

16. A method of stacking ceramic green sheets in accordance with claim 14, wherein said second ceramic green sheet is formed on said second back film after providing said functional material film

* * * * *